(12) United States Patent
Sugiyama et al.

(10) Patent No.: US 10,734,055 B2
(45) Date of Patent: Aug. 4, 2020

(54) MEMORY DEVICE

(71) Applicant: Kabushiki Kaisha Toshiba, Tokyo (JP)

(72) Inventors: Hideyuki Sugiyama, Kanagawa (JP); Naoharu Shimomura, Tokyo (JP); Kazutaka Ikegami, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/128,720

(22) Filed: Sep. 12, 2018

(65) Prior Publication Data

US 2019/0287595 A1   Sep. 19, 2019

(30) Foreign Application Priority Data

Mar. 15, 2018   (JP) .................................. 2018-048216

(51) Int. Cl.
*G11C 11/00* (2006.01)
*G11C 11/16* (2006.01)
(Continued)

(52) U.S. Cl.
CPC ........ *G11C 11/1673* (2013.01); *G11C 11/161* (2013.01); *G11C 11/1659* (2013.01);
(Continued)

(58) Field of Classification Search
CPC .............. G11C 11/1673; G11C 11/161; G11C 11/1659; G11C 11/1675; G11C 11/1697; H01L 27/222; H01L 43/02; H01L 43/10
(Continued)

(56) References Cited

U.S. PATENT DOCUMENTS 6,961,264 B2   11/2005   Tsuchida
7,075,813 B2   7/2006   Moriyama et al.
(Continued)

FOREIGN PATENT DOCUMENTS

JP   2003-317466 A   11/2003
JP   2005-166087 A   6/2005
(Continued)

OTHER PUBLICATIONS

K. Tsuchida et al., "A 64Mb MRAM with Clamped-Reference and Adequate-Reference Schemes," ISSCC 2010 (2010), pp. 258, 259, and continuation sheet showing Figure 14.2.7.

*Primary Examiner* — Huan Hoang
(74) *Attorney, Agent, or Firm* — Finnegan, Henderson, Farabow, Garrett & Dunner, L.L.P.

(57) ABSTRACT

A memory device according to an embodiment includes: a plurality of memory cells including a storage element having a first and second terminals; a reference resistor having a third and fourth terminals; a first current source electrically connected to the first terminal of the storage element in the selected memory cell; a second current source electrically connected to the third terminal; and a determination circuit that determines the greater one among a resistance value of a storage element of selected one and a resistance value of the reference resistor, the resistance value of the reference resistor being smaller than a middle value between a mean value of first resistance values obtained from the storage elements in the high-resistance state and a mean value of second resistance values obtained from the storage elements in the low-resistance state, and greater than the mean value of the second resistance values.

15 Claims, 8 Drawing Sheets

(51) Int. Cl.
*H01L 43/02* (2006.01)
*H01L 27/22* (2006.01)
*H01L 43/10* (2006.01)

(52) U.S. Cl.
CPC ...... *G11C 11/1675* (2013.01); *G11C 11/1697* (2013.01); *H01L 27/222* (2013.01); *H01L 43/02* (2013.01); *H01L 43/10* (2013.01)

(58) Field of Classification Search
USPC .......................................................... 365/158
See application file for complete search history.

(56) References Cited

U.S. PATENT DOCUMENTS

| | | | |
|---|---|---|---|
| 7,453,719 B2 | 11/2008 | Sakimura et al. | |
| 7,751,258 B2 | 7/2010 | Tsuchida | |
| 7,952,916 B2 | 5/2011 | Maeda et al. | |
| 8,570,787 B2 | 10/2013 | Kitagawa et al. | |
| 2009/0010045 A1* | 1/2009 | Ueda | G11C 11/1673 365/158 |
| 2010/0067285 A1 | 3/2010 | Lung et al. | |
| 2017/0076770 A1 | 3/2017 | Daibou et al. | |
| 2019/0088322 A1* | 3/2019 | Pyo | G11C 11/1655 |

FOREIGN PATENT DOCUMENTS

| | | |
|---|---|---|
| JP | 2009-87494 A | 4/2009 |
| JP | 2010-250880 A | 11/2010 |
| JP | 2012-169011 | 9/2012 |
| JP | 5044432 B2 | 10/2012 |
| JP | 2014-220026 A | 11/2014 |
| JP | 2017-59634 | 3/2017 |
| WO | WO 02/073620 A2 | 9/2002 |
| WO | WO 2004/095464 A1 | 11/2004 |

* cited by examiner

US 10,734,055 B2

MEMORY DEVICE

CROSS REFERENCE TO RELATED APPLICATIONS

This application is based upon and claims the benefit of priority from the prior Japanese Patent Application No. 2018-048216, filed on Mar. 15, 2018, the entire contents of which are incorporated herein by reference.

FIELD

Embodiments described herein relate generally to memory devices.

BACKGROUND

Existing memories may be classified into volatile working memories such as static random access memories (SRAMs) and dynamic random access memories (DRAMs), and non-volatile storage memories such as NAND flash memories and hard disk drives (HDDs).

The volatile memories operate at a high speed but consume large power in a standby state due to leakage current. In order to solve this problem, various nonvolatile memories have been studied. Magnetic random access memories (MRAMs) including magnetoresistance devices used as storage elements are nonvolatile memories and may operate at a high speed. Therefore, they are expected to replace the existing working memories.

Magnetic tunnel junction (MTJ) elements are widely used as the magnetoresistance devices. An MTJ element has two state, namely low-resistance state and high-resistance state. Depending on the state of the MTJ element, the resistance of the MTJ element becomes a low resistance or a high resistance state. In a reading operation of the memory, the resistance of the MTJ element is compared with that of a reference resistor, which is between the resistance value of the MTJ element in the low-resistance state and the resistance value of the MTJ element in the high-resistance state. The resistance state of the MTJ element is determined in this manner.

The reference resistor has a resistance value that is intermediate between a mean value of the resistance values of the MTJ elements in the low-resistance state and a mean value of the resistance values of the MTJ elements in the high-resistance state. The resistance value of each MTJ element in the low-resistance state needs to be smaller than the resistance value of the reference resistor and the resistance value of each MTJ element in the high-resistance state needs to be greater than the resistance value of the reference resistor. Most of the MTJ elements meet the two conditions, but in a large-capacity memory device, the two conditions may not be met due to variations in resistance value of the MTJ element.

DETAILED DESCRIPTION

Figure 1:
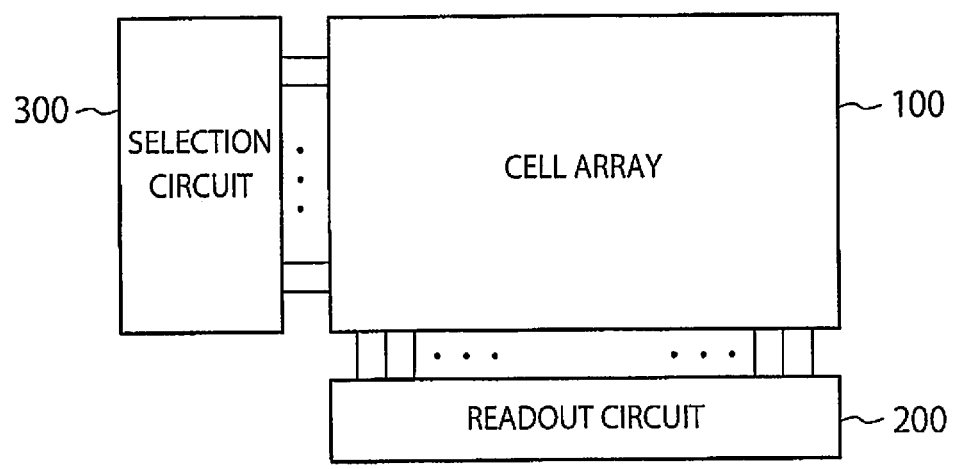
FIG. 1 is a block diagram of a memory device according to a first embodiment.

A memory device according to an embodiment includes: a plurality of memory cells including a storage element having a first terminal and a second terminal, the storage element being changeable from one of a high-resistance state and a low-resistance state to the other; a reference resistor having a third terminal and a fourth terminal; a selection circuit configured to select one of the plurality of memory cells; a first current source electrically connected to a first terminal of a storage element included in the selected one of the plurality of memory cells; a second current source electrically connected to the third terminal of the reference resistor; and a determination circuit configured to determine which is greater between a resistance value of the memory device and a resistance value of the reference resistor, the determination circuit including a first input terminal and a second input terminal, the first input terminal being electrically connected to a second terminal of the storage element included in the selected one of the plurality of memory cells, the second input terminal being electrically connected to the fourth terminal of the reference resistor, the resistance value of the reference resistor being smaller than a middle value between a mean value of first resistance values obtained from the storage elements in the high-resistance state and a mean value of second resistance values obtained from the storage elements in the low-resistance state, and greater than the mean value of the second resistance values.

Embodiments of the present invention will now be described in detail with reference to the accompanying drawings. It should be noted, however, that the drawings are schematic, and the dimensions of each element, the height of each voltage, the length of each time period, the ratio between the dimensions of parts, and the time intervals may be different from those of actual ones. In some drawings, the same element may be illustrated to have different dimensions and different ratios.

First Embodiment

A memory device according to a first embodiment will be described with reference to FIGS. 1 to 3. The memory device according to the first embodiment includes a cell array 100 with memory cells arranged in an array form, a readout circuit 200, and a selection circuit 300. Each memory cell includes a storage element. The storage element is either in a low-resistance state or a high-resistance state. The state of the storage element may be changed from one of the above states to the other by causing write current to flow through the storage element.

In the first embodiment and other embodiments described later, the storage elements meet the following conditions:

a). The ratio m (=Rap/Rp) between a resistance value Rap that is obtained in the case that the storage element of the memory cell included in the cell array 100 is in a high-resistance state and a resistance value Rp that is obtained in the case that the storage element is in a low-resistance state varies only slightly.

b). There is a correlation between the high-resistance value Rap and the low-resistance value Rp, which may be expressed by the following formula:

$$Rap = mRp \qquad (1).$$

c). In the cell array 100, the high-resistance value Rap and the low-resistance value Rp of the storage element each have a normal distribution. The normal distribution of the low-resistance value Rp has a standard deviation $a_p$, and the normal distribution of the high-resistance value Rap has a standard deviation $m\sigma_p$.

Herein, a normal distribution with a mean value a and a standard deviation b is expressed as $G_b^a$. Therefore, if the low-resistance value Rp has a normal distribution $G_{\sigma p}^{<R>}$ with a mean value <Rp> and a standard deviation $\sigma_p$, the high-resistance value Rap has a normal distribution $G_{m\sigma p}^{m<Rp>}$ with a mean value m<Rap> and a standard deviation $m\sigma_p$.

Under the aforementioned conditions, the readout circuit 200 reads a resistance value of a storage element in a selected memory cell of the cell array 100. In the read operation, the state of the selected storage element either the high-resistance state or the low-resistance state is determined by comparing the resistance value of the storage element with the reference resistance value.

Since the standard deviation $\sigma_p$ of the low-resistance values Rp is not equal to the standard deviation $m\sigma_p$ of the high-resistance values, if the reference resistance value is a middle value between the mean value <Rp> of the low-resistance values and the mean value <Rap> of the high-resistance values, the yield may be lowered in a large-capacity memory device.

Therefore, in this embodiment, a resistance value at which the normal distribution $G_\sigma^{<Rp>}$ of the low-resistance value Rp matches the normal distribution $G_{m\sigma}^{m<Rp>}$ of the high-resistance value Rap is set as a reference resistance value $R_{ref1}$. The reference resistance value $R_{ref1}$ satisfies the following formula:

$$G_\sigma^{<Rp>} = G_{m\sigma}^{m<Rp>} \qquad (2).$$

As a result, a high yield may be obtained even in a large capacity memory device.

Taking the natural log of both sides of the formula (2) makes a second degree equation with respect to the reference resistance value $R_{ref1}$. The following formula can be obtained by solving the second degree equation:

$$R_{ref1} = \frac{1}{1-\frac{1}{m^2}}\left[\left(1-\frac{1}{m}\right) + \sqrt{\left(1-\frac{1}{m}\right)^2 + 2\left(1-\frac{1}{m^2}\right)\left(\frac{\sigma_p}{\langle R_p \rangle}\right)^2 \log m}\right]\langle R_p\rangle \qquad (3)$$

Figure 2:
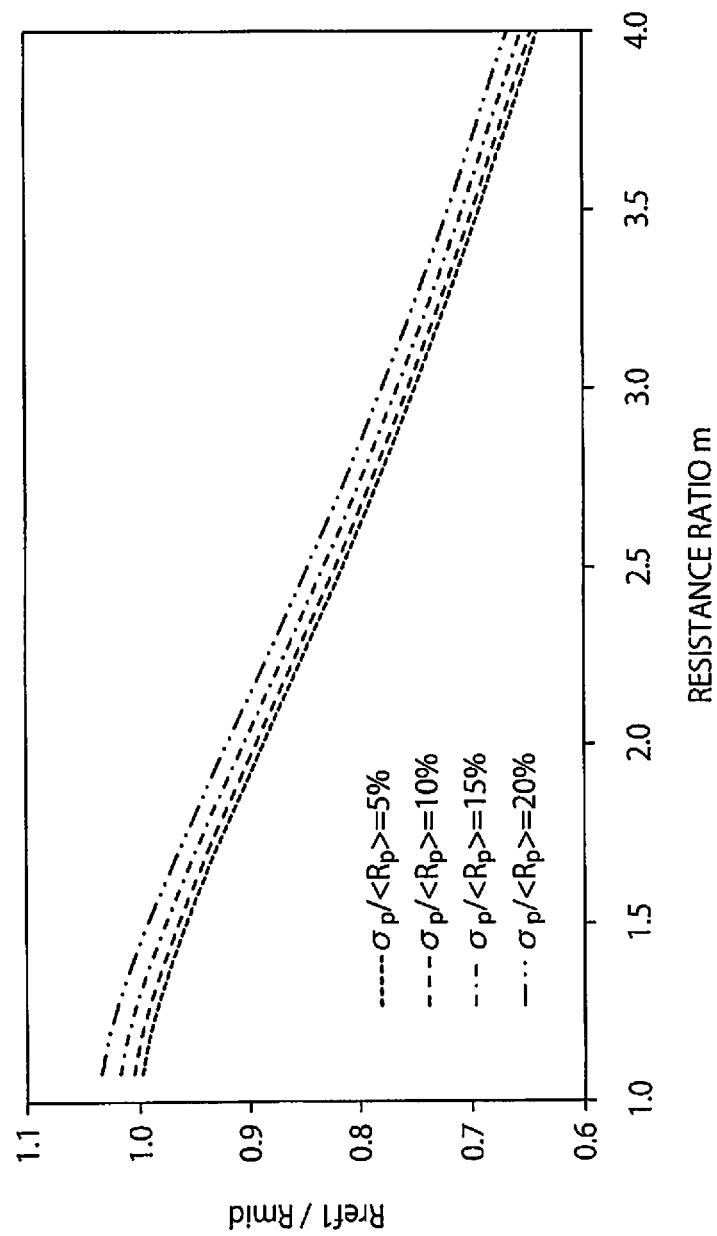
FIG. 2 is an explanatory diagram of a reference resistance value used in a readout circuit of the memory device according to the first embodiment.

FIG. 2 shows a relation between the resistance value $R_{ref1}$ obtained by the formula (3) and the resistance ratio m in the case that the ratio of the standard deviation $\sigma_p$ to the mean value <Rp> of the low-resistance values is set to be 5%, 10%, 15%, and 20% in the formula (3). In FIG. 2, the horizontal axis represents the resistance ratio m, and the vertical axis represents a ratio (=$R_{ref1}/R_{mid}$) of the resistance value $R_{ref1}$ to the middle resistance value $R_{mid}$ (=(<Rp>+<Rap>)/2). As can be understood from FIG. 2, if m is equal to or more than 1.5, the resistance value $R_{ref1}$ is smaller than the middle resistance value $R_{mid}$. For example, if m is 2.0, the resistance value $R_{ref1}$ is almost 80% of the middle resistance value $R_{mid}$. Thus, in this embodiment, the resistance value $R_{ref1}$ is smaller than the middle resistance value $R_{mid}$.

Figure 3:
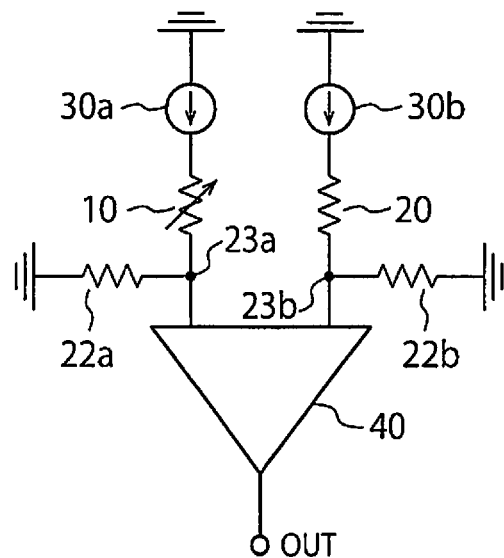
FIG. 3 is a circuit diagram illustrating an example of the readout circuit of the memory device according to the first embodiment.

FIG. 3 illustrates an example of the readout circuit 200 included in the memory device according to the first embodiment. The readout circuit 200 includes a reference resistor 20, resistors 22a and 22b, constant current sources 30a and 30b, and a sense amplifier (determination circuit) 40. A storage element 10 of a memory cell selected from the cell array 100 by the selection circuit 300 is connected in series with the resistor 22a, and the reference resistor 20 is connected in series with the resistor 22b. The storage element 10 has a first terminal that is electrically connected to the constant current source 30a, and a second terminal that is electrically connected to a terminal 23a of the resistor 22a. The other terminal of the resistor 22a is grounded. The reference resistor 20 has a first terminal that is electrically connected to the constant current source 30b, and a second terminal that is electrically connected to a terminal 23b of the resistor 22b. The other terminal of the resistor 22b is grounded. The state in which A is electrically connected to B herein means that A may be directly connected to B or that A may be indirectly connected to B via a conductor. The sense amplifier 40 compares voltage at the terminal 23a with voltage at the terminal 23b to determine the state of the storage element 10 either as a low-resistance state or a high-resistance state, and sends the result to an external device as an output OUT.

The constant current source 30a supplies current with a constant current value Imtj, and the constant current source 30b supplies current with a constant current value Iref. In this embodiment, the constant current value Imtj is substantially equal to the constant current value Iref. The resistance value of the resistor 22a is substantially equal to the resistance value of the resistor 22b.

The sense amplifier 40 includes two input terminals, and outputs either high voltage or low voltage as the output OUT depending on the difference in voltage between the two input terminals. The readout circuit 200 shown in FIG. 3 may determine the resistance state of the storage element.

In this embodiment, the resistance value of the reference resistor is obtained by using the formula (3). The mean value <Rp> of the low-resistance values in the formula (3) is the mean value <Rp> of the low-resistance values of all the storage elements read by using the sense amplifier 40 show in FIG. 3, namely all the storage elements that are electrically connected to the sense amplifier 40. Since the storage elements are formed in the same process, variation in the resistance values of the storage elements is small. Therefore, in obtaining the mean value, the resistance values of several (for example, ten) storage elements may be obtained instead of all of the storage elements, and the mean value of the resistance values of such storage elements may be set as the mean value <Rp>.

The resistance ratio m is a ratio of the mean value <Rap> of the high-resistance values to the mean value <Rp> of the low-resistance values of all the storage elements, which may be read by using the sense amplifier 40 shown in FIG. 3. If there are a plurality of reference resistors in the readout circuit 200, the mean value <Rp> of the low-resistance values of all of the storage elements electrically connected to the sense amplifiers that are electrically connected to the respective reference resistors may be used.

According to the first embodiment, the resistance value of the reference resistor is substantially equal to the value $R_{ref1}$ obtained by the formula (3). Therefore, the resistance value of all the storage elements in the low-resistance state is smaller than the resistance value of the reference resistor, and the resistance value of all the storage elements in the high-resistance state is greater than the resistance value of the reference resistor. Therefore, in a read operation, the resistance state of all the storage elements may be correctly read. The above description "the resistance value of the reference resistor is substantially equal to the value $R_{ref1}$ obtained by the formula (3)" herein means that the resistance value of the reference resistor is within a range of the effect of this embodiment, in which a highly accurate read operation may be performed.

Thus, in this embodiment, a correct read operation may be performed even if the resistance value of the storage elements in a large-capacity memory device varies.

A large-capacity memory device may be achieved by producing a large-capacity memory including the reference resistor and the storage elements according to this embodiment several times, with the resistance value of the reference resistor being set in a range from −5% to +5% of the mean value of the resistance values $R_{ref1}$.

As described above, a memory device that performs a highly accurate read operation may be provided according to the first embodiment.

First Example

Figure 4:
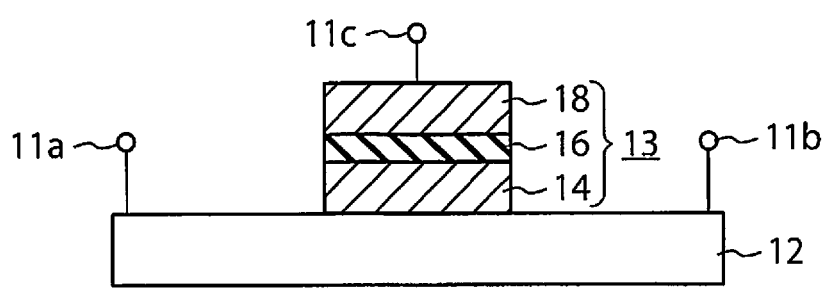
FIG. 4 is a cross-sectional view of a storage element included in a memory cell of the memory device according to the first embodiment.

A first example of the memory device according to the first embodiment will be described below. The memory device of the first example includes a storage element 10A shown in FIG. 4 as the storage element of the memory device according to the first embodiment. The storage element 10A includes terminals 11a to 11c, a conductive layer 12, and an MTJ element 13. The MTJ element 13 includes a magnetic layer ("storage layer") 14 disposed on the conductive layer 12, the direction of magnetization of the magnetic layer 14 being changeable, an insulating layer ("tunnel barrier layer") 16 disposed on the storage layer 14, and a magnetic layer ("reference layer") 18 disposed on the insulating layer 16, the direction of magnetization of the magnetic layer 18 being fixed. The terminals 11a and 11b are electrically connected to the conductive layer 12, and the terminal 11c is electrically connected to the magnetic layer 18. The MT) element 13 is disposed in a region between the terminal 11a and the terminal 11b on the conductive layer 12.

The resistance of the storage element 10A is in a high-resistance state in the case that the magnetization direction of the magnetic layer 14 and the magnetization direction of the magnetic layer 18 are antiparallel (opposite) to each other, and in a low-resistance state in the case that the magnetization direction of the magnetic layer 14 and the magnetization direction of the magnetic layer 18 are parallel to each other.

A write operation is performed on the storage element 10A by causing write current to flow between the terminal 11a and the terminal 11b. In this case, a spin torque is applied to the magnetization of the magnetic layer 14 due to the spin orbit interaction, and the magnetization direction of the magnetic layer 14 is switched. The direction of the switching of the magnetization direction of the magnetic layer 14 is changed depending on the direction of the write current flowing between the terminal 11a and the terminal 11b.

A read operation is performed by causing read current to flow between the terminal 11c and one of the terminal 11a and the terminal 11b. The terminal electrically connected to the terminal 23a of the readout circuit 200 in FIG. 3 is the terminal 11c, for example, and the terminal electrically connected to the current source 30a is one of the terminal 11a and the terminal 11b, for example. The terminal electrically connected to the terminal 23a of the readout circuit 200 may be one of the terminal 11a and the terminal 11b, for example, and the terminal electrically connected to the current source 30a may be the terminal 11c.

The storage element 10A satisfies the conditions a) to c) provided in the descriptions of the first embodiment. The magnetic layers 14 and 18 are formed from CoFeB, and the nonmagnetic layer 16 is formed from MgO in the MTJ element 13.

The reference resistor of this example is formed from a material having resistance mentioned in the descriptions of the first embodiment, such as arsenic (As)-doped polycrystalline silicon (Si).

Like the memory device according to the first embodiment, the memory device of the first example may perform a highly accurate read operation.

Second Example

Figure 5:
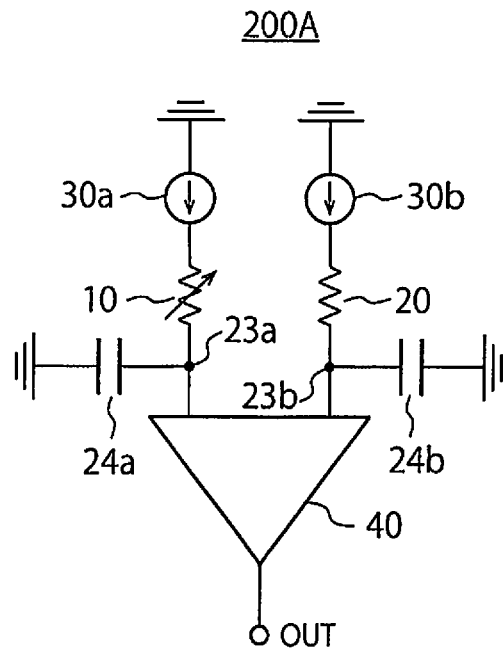
FIG. 5 is a circuit diagram illustrating an example of a readout circuit of a memory device according to a second embodiment.

A memory device of a second example includes a readout circuit 200A shown in FIG. 5 instead of the readout circuit 200 according to the first embodiment and the first example shown ion FIG. 3. The readout circuit 200A is obtained by replacing the resistors 22a and 22b of the readout circuit 200 shown in FIG. 3 with capacitors 24a and 24b.

The capacitors 24a and 24b have substantially the same capacitance value. With this configuration, the resistance state of the storage element 10 is determined by setting the voltage of the storage element 10 and the voltage of the reference resistor 20 to be equal to each other before the read operation, causing the same current to flow through the storage element 10 and the reference resistor 20 at the same time, and reading an output of the sense amplifier 40 after a predefined period.

The capacitor 24a and the capacitor 24b may be formed from capacitance components between a wiring line and a ground line, or a wiring line and a voltage line.

As described above, according to the first and second examples, a memory device that performs a highly accurate read operation may be provided.

As long as the resistance state of the storage element is determined without any problem, the readout circuit of the memory device according to the first embodiment and its examples may include transistors that is not shown in FIGS. 3 and 5.

In this embodiment and its examples, the sense amplifier 40 includes either the resistors 22a and 22b or the capacitors 24a and 24b. However, these elements may be included in the sense amplifier.

The first example and the second example include the MTJ element 13 as the storage element. However, a giant magnetoresistance (GMR) effect element having a multi-layer structure of ferromagnetic material/nonmagnetic conductor/ferromagnetic material may be used as the storage element.

The magnetic layers 14 and 18 of the MTJ element 13 may be single metal layers including any of Ni, Fe and Co, or alloy layers including an alloy of the above elements such as Ni—Fe, Co—Fe, Co—Ni, or Co—Fe—Ni.

The magnetic layers 14 and 18 may also be amorphous material layer including (Co, Fe, Ni)—(Si, B), (Co, Fe, Ni)—(Si, B)—(P, Al, Mo, Nb, Mn) or Co—(Zr, Hf, Nb, Ta, Ti).

The magnetic layers 14 and 18 may also be Heusler alloy layers having a composition expressed as $X_2YZ$, where X is Co, Y is at least one of V, Cr, Mn, and Fe, and Z is at least one of Al, Si, Ga, and Ge.

The magnetic layers 14 and 18 may have a multilayer structure including the aforementioned layers.

The magnetic layers 14 and 18 may also be perpendicular magnetization material layers that are alloy layers including any of FePt, CoPt, CoCrPt, and (Co, Fe, Ni)—(Pt, Ir, Pd, Rh)—(Cr, Hf, Zr, Ti, Al, Ta, Nb) or multilayer films of (Co, Fe)/(Pt, Ir, Pd).

A nonmagnetic element such as silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb) may be added to the magnetic layers 14 and 18 to adjust the magnetic characteristics and other characteristics such as crystallinity, mechanical characteristics, and chemical characteristics.

The nonmagnetic layer 16 may be a layer of at least one insulating material selected from aluminum oxide ($Al_2O_3$), silicon oxide ($SiO_2$), magnesium oxide (MgO), aluminum nitride (AlN), silicon nitride (SiN), bismuth oxide ($Bi_2O_3$), magnesium fluoride ($MgF_2$), calcium fluoride ($CaF_2$), strontium titanate ($SrTiO_3$), lanthanum aluminate ($LaAlO_3$), aluminum oxinitride (Al—N—O), and hafnium oxide (HfO).

The nonmagnetic layer 16 may also be a layer including at least one of copper, silver, gold, vanadium, chromium, and ruthenium, or a layer including a composite of the above elements, or a layer of the above elements including an insulating material for current constriction.

Although the sense amplifier is used to determine the resistance value of the storage element and the resistance value of the reference resistor in this embodiment and its examples, a comparator may also be used.

A circuit for determining the resistance value of the storage element and the resistance value of the reference resistor may also be used instead of the sense amplifier.

Although As-doped Si is used to form the reference resistor in this embodiment, a metal material, an alloy material, a compound material including a metal element, or a composite material including these materials may be used to form the reference resistor.

A Si semiconductor material to which an impurity selected from B, Al, Ga, In, Tl, P, As, Sb, Bi, S, Se, Te, and Po is doped may also be used to form the reference resistor.

A semiconductor material selected from C, Si, Ge, SiGe, GaAs, AlGaAs, InP, and InSb to which an impurity is doped may also be used to form the reference resistor.

The reference resistor may also be formed from a material including C, an alloy material including C, or a compound material including C.

The reference resistor may also be formed from a semiconductor material to which an impurity is doped.

The reference resistor may also be formed from a compound material including a semiconductor material.

The constant current source 30a and the constant current source 30b of this embodiment may be replaced with constant voltage sources. Alternatively, constant power sources may be used instead of the constant current sources.

Second Embodiment

A memory device according to a second embodiment will be described with reference to FIGS. 6 and 7. The memory device according to this embodiment is obtained by replacing the reference resistor 20 in the memory device according to the first embodiment and its examples with a reference resistor 20A shown in FIG. 6.

The reference resistor 20A includes four resistance elements $20A_1$ to $20A_4$ and two terminals $20Ab_1$ and $20Ab_2$. Each resistance element has the same structure as the storage element of the memory cell. The resistance element $20A_1$ is connected in series with the resistance element $20A_2$ to form a first series circuit, and the resistance element $20A_3$ is connected in series with the resistance element $20A_4$ to form a second series circuit. The first series circuit and the second series circuit are connected in parallel. One terminal of the first series circuit and one terminal of the second series circuit are connected to the terminal $20Ab_1$ of the reference resistor 20A, and the other terminal of the first series circuit and the other terminal of the second series circuit are connected to the terminal $20Ab_2$ of the reference resistor 20A. One of the terminal $20Ab_1$ and the terminal $20Ab_2$ of the reference resistor 20A is electrically connected to the current source 30b shown in FIG. 3, and the other is electrically connected to the terminal 23b shown in FIG. 3.

The resistance element $20A_1$ and the resistance element $20A_2$ are in the low-resistance state and have a resistance value Rp, and the resistance element $20A_3$ and the resistance element $20A_4$ are in the high-resistance state and have a resistance value Rap.

The resistance value (reference resistance value) of the reference resistor 20A in this embodiment is the resistance value between the terminal $20Ab_1$ and the terminal $20Ab_2$.

The mean value of the resistance values in the case that all of the storage elements of the memory cells connected to the sense amplifier shown in FIG. 3 is in the low-resistance state is defined as $<Rp>$, the mean value of the resistance values in the case that all of the storage elements are in the high-resistance state is defined as $<Rap>$, the middle value between the mean value $<Rp>$ and the mean value $<Rap>$ is defined as $R_{mid}$, and the resistance ratio m is determined as m=$<Rap>/<Rp>$. The resistance value $R_{ref}$ of the reference resistor 20A in this embodiment is set at a value $R_{ref2}$ expressed by the following formula (4):

$$R_{ref2} = \frac{2m}{m+1}\langle R_p \rangle \quad (4)$$

Figure 6:
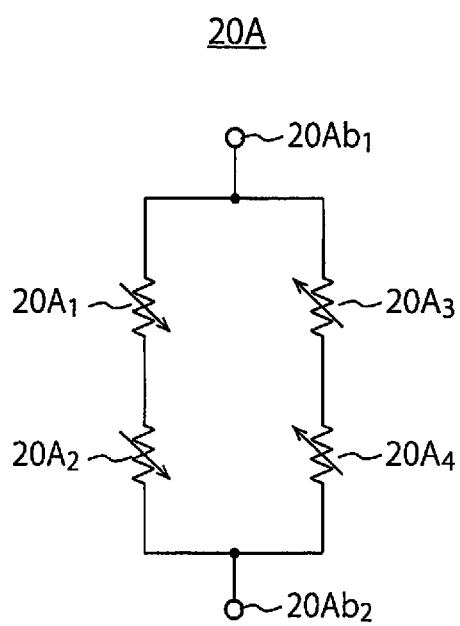
FIG. 6 is a circuit diagram showing a reference resistor in the readout circuit of the memory device according to the second embodiment.

The mean value $R_{ref}$ of the resistance values of the reference resistor 20A shown in FIG. 6 is substantially the resistance value $R_{ref2}$. The resistance value $R_{ref2}$ is equal to a value in the case that the standard deviation $u_p$ in the low-resistance state is asymptotically approximated to zero in the formula (3).

Figure 7:
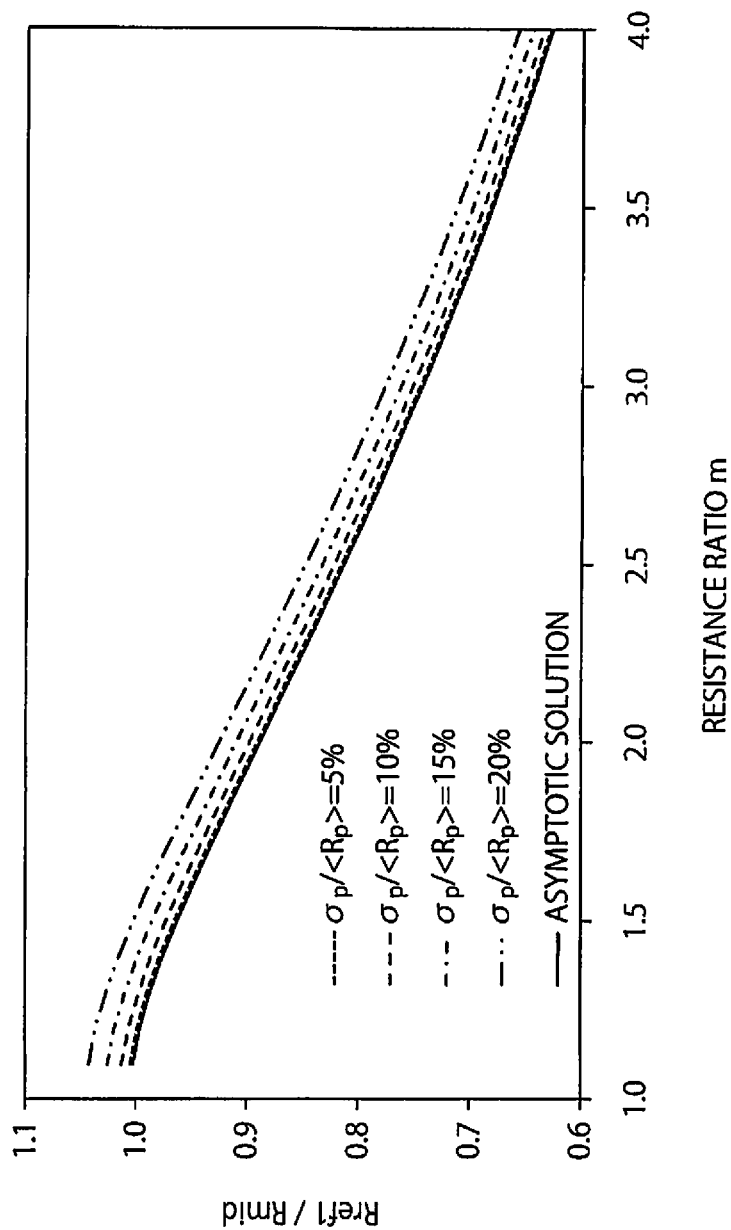
FIG. 7 is a diagram illustrating a relation between a resistance value $R_{ref2}$ and a resistance value $R_{ref1}$.

FIG. 7 shows the relation between the resistance value $R_{ref2}$ and the resistance value $R_{ref1}$. In FIG. 7, the horizontal axis represents the resistance ratio m, and the vertical axis represents the ratio (($R_{ref1}/R_{mid}$) or ($R_{ref2}/R_{mid}$)) of the resistance value $R_{ref1}$ or the resistance value $R_{ref2}$ to the middle resistance value $R_{mid}$ (=(<Rp>+<Rap>)/2). In FIG. 7, a line shown as an asymptotic solution represents $R_{ref2}/R_{mid}$, and other lines represent the ratio ($R_{ref1}/R_{mid}$) corresponding to the cases that the ratio ($\sigma_p$/<Rp>) is 5%, 10%, 15%, and 20%. As can be understood from FIG. 7, if the standard deviation $\sigma_p$ of the resistance values Rp in the case that the storage element is in the low-resistance state is small, the resistance value $R_{ref2}$ becomes very close to the resistance value $R_{ref1}$. For example, if the ratio $\sigma_p$/<Rp> is 10%, the resistance value $R_{ref1}$ is greater than the resistance value $R_{ref2}$ by about 1%. Since the resistance value $R_{ref2}$ is very close to the resistance value $R_{ref1}$, a correct read operation may be performed even in a large-capacity memory.

Since the storage elements of the memory cells in the cell array have the same structure and formed by the same process as the elements of the reference resistor 20A, the mean value $R_{ref}$ of the resistance values of the reference resistor 20A may be easily set at a value that is substantially the same as $R_{ref2}$. Therefore, the reference resistor 20A preferably includes elements having the same structure as the storage elements of the memory cells as in this embodiment.

Since the storage elements of the memory cells in the cell array have the same structure and formed by the same process as the resistance elements included in the reference resistor 20A, the mean value $R_{ref}$ of the resistance values of the reference resistor 20A becomes substantially the same as the resistance value $R_{ref2}$ even if the mean value <Rp> of the resistance values and the resistance ratio m vary in the manufacturing process. Therefore, the reference resistor 20A preferably includes elements having the same structure as the storage elements of the memory cells like this embodiment.

If the MTJ element is used as the storage element, the resistance is dependent on the voltage, and as the voltage decreases, the resistance increases. The voltage applied to one resistance element (MTJ element) of the reference resistor 20A shown in FIG. 6 is about a half of the voltage applied to the MTJ element of the memory cell. Therefore, the mean value $R_{ref}$ of the resistance values of the reference resistor 20A shown in FIG. 6 is greater than the resistance value $R_{ref2}$ and becomes closer to the resistance value $R_{ref1}$. This is more preferable.

As the mean value $R_{ref}$ of the resistance values of the reference resistor 20A is substantially the same as the resistance value $R_{ref2}$, the resistance value of most of the storage elements in the low-resistance state of the large-capacity memory becomes smaller than the resistance value of the reference resistor, and the resistance value of most of the storage elements in the high-resistance state becomes greater than the resistance value of the reference resistor. Therefore, the resistance state of most of the storage elements may be correctly read in a read operation.

According to this embodiment, a correct read operation may be performed even if the resistance value of the storage elements in a large-capacity memory varies.

A large-capacity memory device may be achieved by producing a large-capacity memory including the reference resistor and the storage elements according to this embodiment several times, with the resistance value of the reference resistor 20A being set in a range from −5% to +5% of the mean value of the resistance values $R_{ref1}$.

As described above, according to the second embodiment, a memory device that performs a highly accurate read operation may be provided.

Third Embodiment

A memory device according to a third embodiment will be described with reference to FIG. 8. The memory device according to this embodiment is obtained by replacing the reference resistor 20 of the memory device according to any of the first embodiment and its examples with a reference resistor 20B shown in FIG. 8.

The reference resistor 20B includes four resistance elements $20B_1$ to $20B_4$ and two terminals $20Bb_1$ and $20Bb_2$. The resistance elements have the same structure as the storage elements of the memory cells. The resistance element $20B_1$ is connected in series with the resistance element $20B_2$ to form a first series circuit, and the resistance element $20B_3$ is connected in series with the resistance element $20B_4$ to form a second series circuit. The first series circuit and the second series circuit are connected in parallel. One terminal of the first series circuit and one terminal of the second series circuit are connected to the terminal $20Bb_1$ of the reference resistor 20B, and the other terminal of the first series circuit and the other terminal of the second series circuit are connected to the terminal $20Bb_2$ of the reference resistor 20B. One of the terminal $20Bb_1$ and the terminal $20Bb_2$ of the reference resistor 20B is electrically connected to the current source 30b shown in FIG. 3, and the other is electrically connected to the terminal 23b shown in FIG. 3. In this embodiment, the resistance value of each of the resistance elements $20B_1$ to $20B_4$ is substantially set at the resistance value $R_{ref2}$.

Figure 8:
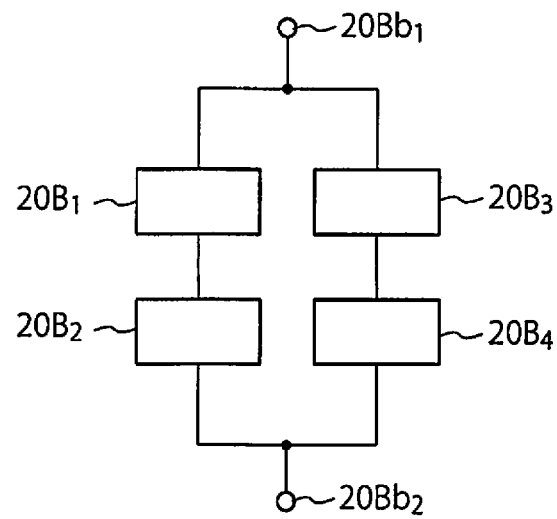
FIG. 8 is a circuit diagram showing a reference resistor in a readout circuit of a memory device according to a third embodiment.

The resistance value of the reference resistor in this embodiment is the resistance value between the terminal $20Bb_1$ and the terminal $20Bb_2$ shown in FIG. 8.

The mean value of the resistance values in the case that all of the storage elements of the memory cells connected to the sense amplifier shown in FIG. 3 are in the low-resistance state is defined as <Rp>, the mean value of the resistance values in the case that all of the storage elements are in the high-resistance state is defined as <Rap>, the middle value between the mean value <Rp> and the mean value <Rap> is defined as $R_{mid}$, and the resistance ratio m is set at m=<Rap>/<Rp>. The resistance value $R_{ref2}$ of the reference resistor 20B according to this embodiment is expressed by the following formula (5):

$$R_{ref2} = \frac{2m}{m+1} \langle R_p \rangle \quad (5)$$

The mean value $R_{ref}$ of the resistance values of the reference resistor 20B shown in FIG. 8 is substantially the resistance value $R_{ref2}$.

In this embodiment, the mean value $R_{ref}$ of the resistance values of the reference resistor is substantially equal to the resistance value $R_{ref2}$. Therefore, like the second embodiment, the resistance state of most of the storage elements may be correctly read in a read operation performed on a large-capacity memory.

In this embodiment, the resistance value of each resistance element $20B_i$ (i=1, ..., 4) is substantially set at the resistance value $R_{ref2}$. Therefore, the resistance element $20B_1$ (i=1, ..., 4) may be the reference resistor 20A shown in FIG. 6 including four resistance elements. In this case, the reference resistor 20B includes 16 resistance elements. This further reduces variation in resistance value of the reference resistor. It is preferable that the reference resistor according to this embodiment is used.

Since the storage elements of the memory cells included in the cell array have the same structure as the elements included in the reference resistor 20B and formed in the same process, the mean value $R_{ref}$ of the resistance values of the reference resistor may be easily set substantially at $R_{ref2}$. Therefore, it is preferable that the resistance elements of the reference resistor 20B have the same structure as the storage elements of the memory cells like this embodiment.

Since the storage elements of the memory cells included in the cell array have the same structure and formed in the same process as the elements included in the reference resistor 20B, if the mean value <Rp> of the resistance values and the resistance ratio m vary during the manufacturing process, the mean value $R_{ref}$ of the resistance values of the reference resistor 20B is substantially at the resistance value $R_{ref2}$. Therefore, it is preferable that the resistance elements of the reference resistor 20B have the same structure as the storage elements of the memory cells like this embodiment.

If the MTJ element is used as the storage element, the resistance is dependent on the voltage, and as the voltage decreases, the resistance increases. The voltage applied to one resistance element (MTJ element) of the reference resistor 20B shown in FIG. 8 is about a fourth of the voltage applied to the MT) element of the memory cell. Therefore, the mean value $R_{ref}$ of the resistance values of the reference resistor 20B shown in FIG. 8 is greater than the resistance value $R_{ref2}$ and becomes closer to the resistance value $R_{ref1}$. This is more preferable.

As the mean value $R_{ref}$ of the resistance values of the reference resistor 20B is substantially the same as the resistance value $R_{ref2}$, the resistance value of most of the storage elements in the low-resistance state of the large-capacity memory becomes smaller than the resistance value of the reference resistor, and the resistance value of most of the storage elements in the high-resistance state becomes greater than the resistance value of the reference resistor. Therefore, the resistance state of most of the storage elements may be correctly read in a read operation.

According to this embodiment, a correct read operation may be performed even if the resistance value of the storage elements in a large-capacity memory varies.

A large-capacity memory device may be achieved by producing a large-capacity memory including the reference resistor and the storage elements according to this embodiment several times, with the resistance value of the reference resistor being set in a range from −5% to +5% of the mean value of the resistance values $R_{ref1}$.

Although one reference resistor includes 16 resistance elements in this embodiment, 4 to the power of n (n≥3) of resistance elements shown in FIG. 6 may be combined to form a reference resistor in which the mean value of the resistance values is equal to the resistance value $R_{ref2}$.

As described above, according to the third embodiment, a memory device that performs a highly accurate read operation may be provided.

Fourth Embodiment

A memory device according to a fourth embodiment will be described with reference to FIG. 9. The memory device according to this embodiment is obtained by replacing the reference resistor 20 of the memory device according to any of the first embodiment and its examples with a reference resistor 20C shown in FIG. 9.

Figure 10:
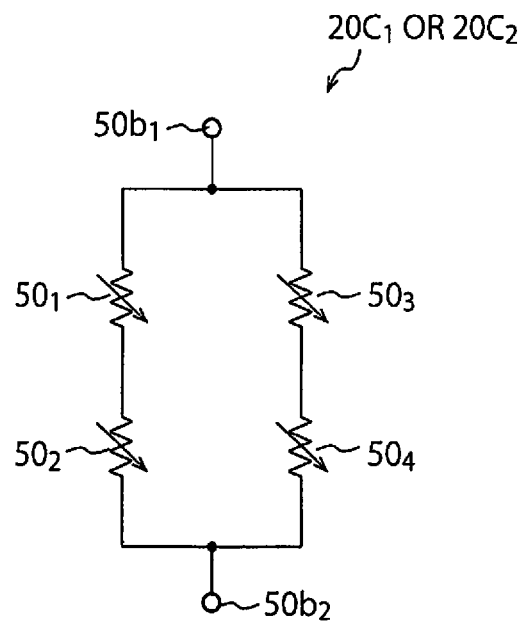
FIG. 10 is a diagram showing a resistance circuit included in the reference resistor according to the fourth embodiment.

The reference resistor 20C includes four resistance circuits $20C_1$ to $20C_4$ and two terminals $20Cb_1$ and $20Cb_2$. The resistance circuit $20C_1$ is connected in series with the resistance circuit $20C_2$ to form a first series circuit, and the resistance circuit $20C_3$ is connected in series with the resistance circuit $20C_4$ to form a second series circuit. The first series circuit and the second series circuit are connected in parallel. One terminal of the first series circuit and one terminal of the second series circuit are connected to the terminal $20Cb_1$ of the reference resistor 20C, and the other terminal of the first series circuit and the other terminal of the second series circuit are connected to the terminal $20Cb_2$ of the reference resistor 20C. One of the terminal $20Cb_1$ and the terminal $20Cb_2$ of the reference resistor 20C is electrically connected to the current source 30b shown in FIG. 3, and the other is electrically connected to the terminal 23b shown in FIG. 3. The resistance circuit $20C_1$ and the resistance circuit $20C_2$ in this embodiment have the structure shown in FIG. 10. Specifically, each of the resistance circuit $20C_1$ and the resistance circuit $20C_2$ has four resistance elements $50_1$ to $50_4$ and two terminals $50b_1$ and $50b_2$. The resistance element $50_1$ is connected in series with the resistance element $50_2$ to form a first series circuit, and the resistance element $50_3$ is connected in series with the resistance element $50_4$ to form a second series circuit. The first series circuit and the second series circuit are connected in parallel. One terminal of the first series circuit and one terminal of the second series circuit are connected to the terminal $50b_1$, and the other terminal of the first series circuit and the other terminal of the second series circuit are connected to the terminal $50b_2$. The resistance value of each of the four resistance elements $50_1$ to $50_4$ is set at the mean value <Rp> of the resistance values of the storage elements in the low-resistance state of the memory cells electrically connected to the sense amplifier 40 of the readout circuit 200 shown in FIG. 3. The resistance elements $50_1$ to $50_4$ have the same structure as the storage elements of the memory cells.

Figure 11:
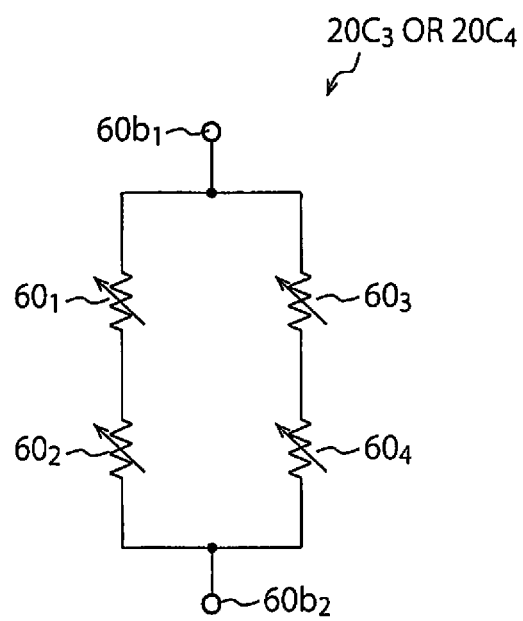
FIG. 11 is a diagram showing a resistance circuit included in the reference resistor according to the fourth embodiment.

The resistance circuit $20C_3$ and the resistance circuit $20C_4$ have the structure shown in FIG. 11. Specifically, each of the resistance circuit $20C_3$ and the resistance circuit $20C_4$ includes four resistance elements $60_1$ to $60_4$ and two terminals $60b_1$ and $60b_2$. The resistance element $60_1$ is connected in series with the resistance element $60_2$ to form a first series circuit, and the resistance element $60_3$ is connected in series with the resistance element $60_4$ to form a second series circuit. The first series circuit and the second series circuit are connected in parallel. One terminal of the first series circuit and one terminal of the second series circuit are connected to the terminal $60b_1$, and the other terminal of the first series circuit and the other terminal of the second series circuit are connected to the terminal $60b_2$. The resistance value of each of the four resistance elements $60_1$ to $60_4$ is set at the mean value <Rap> of the resistance values of the storage elements in the high-resistance state in the memory cells electrically connected to the sense amplifier 40 of the readout circuit 200 shown in FIG. 3. The resistance elements $60_1$ to $60_4$ have the same structure as the storage elements of the memory cells.

Figure 9:
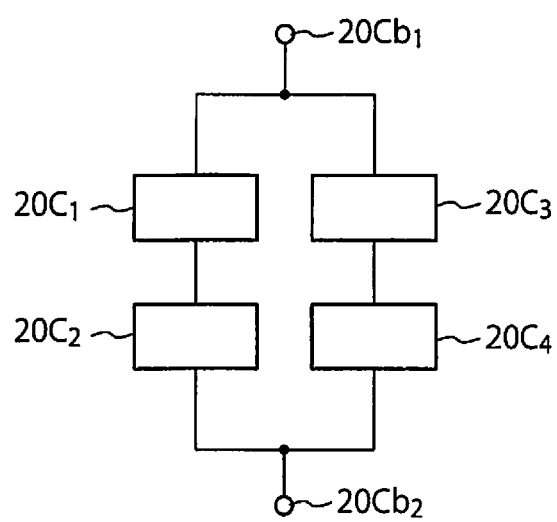
FIG. 9 is a block diagram showing a reference resistor in a readout circuit of a memory device according to a fourth embodiment.

In this embodiment having the aforementioned structure, the resistance value of the reference resistor 20C shown in FIG. 9 is expressed by the following formula (6):

$$R_{ref2} = \frac{2m}{m+1}\langle R_p \rangle \quad (6)$$

The mean value $R_{ref}$ of the resistance values of the reference resistor 20C shown in FIG. 9 is substantially equal to the resistance value $R_{ref2}$.

Since the mean value $R_{ref}$ of the resistance values of the reference resistor is substantially equal to the resistance value $R_{ref2}$ in this embodiment. Therefore, like the second embodiment, the resistance state of most of the storage elements may be correctly read in a read operation performed on a large-capacity memory.

In this embodiment, the reference resistor 20C includes 16 resistance elements. This further reduces variation in resistance value of the reference resistor. It is therefore preferable that the reference resistor according to this embodiment be used.

Since the storage elements of the memory cells included in the cell array have the same structure and formed in the same process as the elements included in the reference resistor 20C, the mean value $R_{ref}$ of the resistance values of the reference resistor 20C may be easily set substantially at $R_{ref2}$. Therefore, it is preferable that the resistance elements of the reference resistor 20C have the same structure as the storage elements of the memory cells like this embodiment.

Since the storage elements of the memory cells included in the cell array have the same structure and formed in the same process as the elements included in the reference resistor 20C, if the mean value <Rp> of the resistance values and the resistance ratio m vary during the manufacturing process, the mean value $R_{ref}$ of the resistance values of the reference resistor 20C is substantially at the resistance value $R_{ref2}$. Therefore, it is preferable that the resistance elements of the reference resistor 20C have the same structure as the storage elements of the memory cells like this embodiment.

If the MTJ element is used as the storage element, the resistance is dependent on the voltage, and as the voltage decreases, the resistance increases. The voltage applied to one resistance element (MTJ element) of the reference resistor 20C shown in FIG. 9 is about a fourth of the voltage applied to the MTJ element of the memory cell. Therefore, the mean value $R_{ref}$ of the resistance values of the reference resistor 20C shown in FIG. 9 is greater than the resistance value $R_{ref2}$ and becomes closer to the resistance value $R_{ref1}$. This is more preferable.

As the mean value $R_{ref}$ of the resistance values of the reference resistor 20C is substantially the same as the resistance value $R_{ref2}$, the resistance value of most of the storage elements in the low-resistance state of the large-capacity memory becomes smaller than the resistance value of the reference resistor, and the resistance value of most of the storage elements in the high-resistance state becomes greater than the mean value $R_{ref}$ of the resistance values of the reference resistor. Therefore, the resistance state of most of the storage elements may be correctly read in a read operation.

According to this embodiment, a correct read operation may be performed even if the resistance value of the storage elements in a large-capacity memory varies.

A large-capacity memory device may be achieved by producing a large-capacity memory including the reference resistor and the storage elements according to this embodiment several times, with the resistance value of the reference resistor being set in a range from −5% to +5% of the mean value of the resistance values $R_{ref1}$.

Although one reference resistor includes eight low-resistance state resistance elements and eight high-resistance state resistance elements in this embodiment, resistance elements in the low-resistance state and the same number of resistance elements in the high-resistance state may be combined to form a reference resistor in which the mean value of the resistance values equal to $R_{ref2}$.

As described above, according to the fourth embodiment, a memory device that performs a highly accurate read operation may be provided.

Fifth Embodiment

A memory device according to a fifth embodiment will be described with reference to FIG. 12. The memory device according to the fifth embodiment is obtained by replacing the readout circuit 200 of the memory device according to the first embodiment with a readout circuit 200B shown in FIG. 12.

The readout circuit 200B includes resistors 22a and 22b, an n-channel transistor Tnm ("transistor Tnm"), a sense amplifier 40, and circuits 210, 220, and 230.

An MTJ element 10 of a memory cell selected from the cell array 100 shown in FIG. 1 by the selection circuit 300 includes a first terminal that is grounded, and a second terminal that is electrically connected to one of a source terminal and a drain terminal of the transistor Tnm that serves as a constant current source. The other of the source terminal and the drain terminal of the transistor Tnm is connected to one of input terminals of the sense amplifier 40 via a terminal 23a. One terminal of the resistor 22a is connected to a voltage source Vdd, and the other terminal is connected to the terminal 23a. One terminal of the resistor 22b is connected to the voltage source Vdd, and the other terminal is connected to the other of the input terminals of the sense amplifier 40 via a terminal 23b. The resistance value of the resistor 22a and the resistance value of the resistor 22b are set to be substantially equal to each other.

The circuit 210 includes p-channel transistors ("transistors") Tp0 and Tp1, an n-channel transistor ("transistor") Tn1, a resistor R1_ap, and a constant current source 212. The source terminals of the transistor Tp0 and the transistor Tp1 are connected to the voltage source Vdd, and the gate terminals are connected to each other. The drain terminal of the transistor Tp0 is connected to the gate terminal of the transistor Tp0 and the gate terminal of the transistor Tp1, and also to the current source 212. The drain terminal of the transistor Tp1 is connected to the drain terminal of the transistor Tn1, and the source terminal of the transistor Tn1 is grounded via the resistor R1_ap. The circuit 210 generates voltage Vclmp applied from the drain terminal of the transistor Tp1 and the gate terminal of the transistor Tnm.

The circuit 220 includes a p-channel transistor Tp2, an n-channel transistor Tn2, and a reference resistor 20. The reference resistor 20 may be any of the reference resistors according to the first to fourth embodiments. The source terminal of the transistor Tp2 is connected to the voltage source Vdd, and the drain terminal is connected to the gate terminal and also to the drain terminal of the n-channel transistor Tn2. The gate terminal of the transistor Tn2 is connected to the gate terminal of the transistor Tn1 included in the circuit 210, and the source terminal is grounded via the reference resistor 20. The circuit 220 generates current Iref that flows through the reference resistor 20 when the voltage Vclmp is applied to the gate terminal of the transistor Tn2.

The circuit 230 includes a p-channel transistor Tp3, n-channel transistors Tn3 and Tn4, and resistors R3_p and R4_p. The source terminal of the transistor Tp3 is connected to the voltage source Vdd, the gate terminal is connected to the gate terminal of the transistor Tp2 included in the circuit 220, and the drain terminal is connected to the drain terminal of the transistor Tn3. The gate terminal of the transistor Tn3 is connected to the drain terminal and to the gate terminal of the transistor Tn4, and the source terminal is grounded via the resistor R3_p. The source terminal of the transistor Tn4 is grounded via the resistor R4_p, and the drain terminal is connected to the terminal 23b. The circuit 230 causes current that is substantially equal to the current Iref generated by the circuit 220 to flow through the terminal 23b to generate the voltage Vref. If the resistance value of the storage element 10 is Rref, the voltage Vref is substantially equal to voltage applied to one of the two input terminals (the terminal connected to the terminal 23a) of the sense amplifier 40. If the resistance value of the storage element 10 is Rref, the current Iref is substantially equal to the current flowing through the storage element 10.

The operation of the readout circuit 200B will now be described.

In the readout circuit 200B having the above-described configuration, if the resistance value of the storage element 10 is equal to the resistance value Rref of the reference resistor 20, current Iref2 flows through the storage element 10. If the resistance value of the storage element 10 is equal to the resistance value Rref of the reference resistor 20, voltage Vref2 is applied to one of the terminals (the terminal connected to the terminal 23a) of the sense amplifier 40.

The voltage Vclmp generated by the circuit 210 is applied to the gate terminal of the transistor Tnm connected in series with the storage element 10. The voltage Vclmp is adjusted to be between the power supply voltage Vdd and the reference voltage GND so that the readout circuit 200B may stably operate.

The circuit 220 receives the voltage Vclmp at the gate terminal of the transistor Tn2, and causes current that is substantially equal to the current Iref2 to flow through the reference resistor 20.

The circuit 230 causes current that is substantially equal to the current Iref2 to flow through the resistor R4_p, and applies voltage Vref to the input terminal of the sense amplifier 40 connected to the terminal 23b.

Thus, the voltage Vref is applied to the input terminal of the sense amplifier 40 connected to the terminal 23b, and voltage that is dependent on the resistance value of the storage element 10 is applied to the input terminal of the sense amplifier 40 connected to the terminal 23a.

A correct read operation may be performed in a large-capacity memory device in this manner.

The foregoing just describes the operational principle, and the current flowing through the reference resistor 20 may not be substantially equal to the current Iref2. Even in this case, voltage that is substantially equal to the voltage Vref2 is applied to the input terminal of the sense amplifier 40 connected to the terminal 23b in this embodiment.

Figure 12:
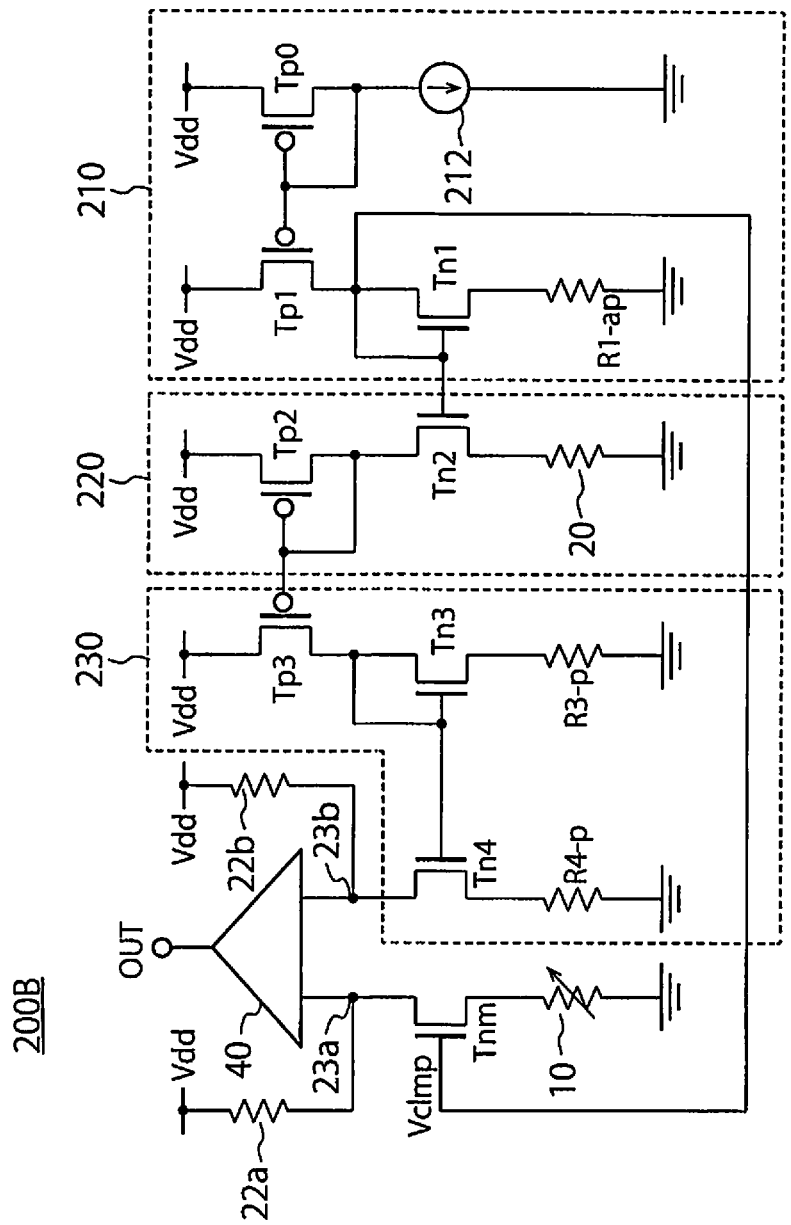
FIG. 12 is a circuit diagram of a readout circuit of a memory device according to a fifth embodiment.

In the memory device according to this embodiment, if the mean value of the resistance values of the storage elements in the low-resistance state included in the memory cells of the cell array 100 shown in FIG. 1, which are electrically connected to the sense amplifier 40 shown in FIG. 12 is defined as <Rp>, the mean value of the resistance values of the storage elements in the high-resistance state is defined as <Rap>, and the mean value m of the resistance ratios is expressed as m=<Rap>/<Rp>, the resistance value of the reference resistor 20 in this embodiment may be expressed by the following formula (7):

$$R_{ref2} = \frac{2m}{m+1} \langle R_p \rangle \tag{7}$$

The reference resistor 20 may be any of the reference resistors of the first to fifth embodiments.

The resistance value of the resistor R1_ap is substantially equal to the resistance value Rap of the storage element 10 in the high-resistance state, and the resistance value of the resistor R3_p is substantially equal to the resistance value Rp of the storage element 10 in the low-resistance state in this embodiment. The resistance value of the resistor R4_p is substantially equal to the resistance value Rp of the storage element 10 in the low-resistance state.

However, in the readout circuit 200B of this embodiment, the resistance value of the resistor R1_ap may be substantially equal to the resistance value Rp of the storage element 10 in the low-resistance state, the resistance value of the resistor R3_p may be substantially equal to the resistance value Rap of the storage element 10 in the high-resistance state, and the resistance value of the resistor R4_p may be substantially equal to the resistance value Rap of the storage element 10 in the high-resistance state.

If the mean value $R_{ref}$ of the resistance values of the reference resistor 20 is set to be substantially equal to the resistance value $R_{ref2}$, the resistance value of most of the storage elements in the low-resistance state of the large-capacity memory becomes smaller than the resistance value of the reference resistor, and the resistance value of most of the storage elements in the high-resistance state becomes greater than the resistance value of the reference resistor. Therefore, the resistance state of most of the storage elements may be correctly read in a read operation.

According to this embodiment, a correct read operation may be performed even if the resistance value of the storage elements in a large-capacity memory varies.

A large-capacity memory device may be achieved by producing a large-capacity memory including the reference resistor and the storage elements according to this embodiment several times, with the resistance value of the reference resistor 20 being set in a range from −5% to +5% of the mean value of the resistance values $R_{ref1}$.

As described above, according to the fifth embodiment, a memory device that performs a highly accurate read operation may be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory device comprising:
a plurality of memory cells each including a storage element having a first terminal and a second terminal, the storage element being changeable from one of a high-resistance state and a low-resistance state to the other;
a reference resistor having a third terminal and a fourth terminal;
a selection circuit configured to select one of the plurality of memory cells;
a first current source electrically connected to a first terminal of a storage element included in the selected one of the plurality of memory cells;
a second current source electrically connected to the third terminal of the reference resistor; and
a determination circuit configured to determine which is greater between a resistance value of the storage element included in the selected one of the plurality of memory cells and a resistance value of the reference resistor, the determination circuit including a first input terminal and a second input terminal, the first input terminal being electrically connected to a second terminal of the storage element included in the selected one of the plurality of memory cells, the second input terminal being electrically connected to the fourth terminal of the reference resistor,
the resistance value of the reference resistor being smaller than a middle value between a mean value of first resistance values obtained from the storage elements in the high-resistance state of the plurality of memory cells and a mean value of second resistance values obtained from the storage elements in the low-resistance state of the plurality of memory cells, and greater than the mean value of the second resistance values.

2. The memory device according to claim 1, wherein the reference resistor includes:
a first circuit including a first resistance element and a second resistance element that are connected in series with each other; and
a second circuit including a third resistance element and a fourth resistance element that are connected in series with each other,
the first circuit and the second circuit being connected in parallel,
the first resistance element and the second resistance element having a resistance value substantially equal to the mean value of the first resistance values, and
the third resistance element and the fourth resistance element having a resistance value substantially equal to the mean value of the second resistance values.

3. The memory device according to claim 1, wherein the reference resistor includes:
a first series circuit including a first resistance circuit and a second resistance circuit that are connected in series; and
a second series circuit including a third resistance circuit and a fourth resistance circuit that are connected in series,
the first series circuit and the second series circuit being connected in parallel,
the first resistance circuit and the second resistance circuit including a first circuit including a first resistance element and a second resistance element that are connected in series, and a second circuit including a third resistance element and a fourth resistance element connected in series, the first circuit and the second circuit being connected in parallel, and each of the first to fourth resistance elements having a resistance value that is substantially equal to the mean value of the first resistance values, and
the third resistance circuit and the fourth resistance circuit including a third circuit including a fifth resistance element and a sixth resistance element that are connected in series, and a fourth circuit including a seventh resistance element and an eighth resistance element that are connected in series, the third circuit and the fourth circuit being connected in parallel, and each of the fifth to eighth resistance elements having a resistance value that is substantially equal to the mean value of the second resistance values.

4. A memory device comprising:
a plurality of memory cells each including a conductive layer having a first terminal and a second terminal and a storage element that is changeable from one of a high-resistance state and a low-resistance state to the other, the storage element being disposed in a region of the conductive layer between the first terminal and the second terminal, the storage element including a first magnetic layer, a second magnetic layer disposed between the region and the first magnetic layer, a nonmagnetic layer disposed between the first magnetic layer and the second magnetic layer, and a third terminal electrically connected to the first magnetic layer, data being written to the storage element by causing current to flow between the first terminal and the second terminal;
a reference resistor having a fourth terminal and a fifth terminal;
a selection circuit configured to select one of the plurality of memory cells;
a first current source configured to be electrically connected to one of the first terminal and the third terminal when the data is read from a storage element of the selected one of the plurality of memory cells;
a second current source electrically connected to the fourth terminal of the reference resistor; and
a determination circuit configured to determine the greater one among a resistance value of the storage element of the selected one and a resistance value of the reference resistor, the determination circuit including a first input terminal and a second input terminal, the first input terminal being electrically connected to the other of the first terminal and the third terminal of the selected one, and the second input terminal being electrically connected to the fifth terminal of the reference resistor,
the resistance value of the reference resistor being smaller than a middle value between a mean value of first resistance values obtained from the storage elements in the high-resistance state of the plurality of memory cells and a mean value of second resistance values obtained from the storage elements in the low-resistance state of the plurality of memory cells, and greater than the mean value of the second resistance values.

5. The memory device according to claim 4, wherein the reference resistor includes:
a first circuit including a first resistance element and a second resistance element that are connected in series with each other; and
a second circuit including a third resistance element and a fourth resistance element that are connected in series with each other,
the first circuit and the second circuit being connected in parallel, the first resistance element and the second resistance element having a resistance value substantially equal to the mean value of the first resistance values, and the third resistance element and the fourth resistance element having a resistance value substantially equal to the mean value of the second resistance values.

6. The memory device according to claim 4, wherein the reference resistor includes:

a first series circuit including a first resistance circuit and a second resistance circuit that are connected in series; and a second series circuit including a third resistance circuit and a fourth resistance circuit that are connected in series, the first series circuit and the second series circuit being connected in parallel, the first resistance circuit and the second resistance circuit including a first circuit including a first resistance element and a second resistance element that are connected in series, and a second circuit including a third resistance element and a fourth resistance element connected in series, the first circuit and the second circuit being connected in parallel, and each of the first to fourth resistance elements having a resistance value that is substantially equal to the mean value of the first resistance values, and the third resistance circuit and the fourth resistance circuit including a third circuit including a fifth resistance element and a sixth resistance element that are connected in series, and a fourth circuit including a seventh resistance element and an eighth resistance element that are connected in series, the third circuit and the fourth circuit being connected in parallel, and each of the fifth to eighth resistance elements having a resistance value that is substantially equal to the mean value of the second resistance values.

7. A memory device comprising:

a plurality of memory cells each including a storage element having a first terminal and a second terminal, the storage element being changeable from one of a high-resistance state and a low-resistance state to the other;

a reference resistor having a third terminal and a fourth terminal;

a selection circuit configured to select one of the plurality of memory cells;

a first current source electrically connected to the first terminal of a storage element of the selected one of the plurality of memory cells;

a second current source electrically connected to the third terminal of the reference resistor; and a determination circuit configured to determine the greater one among a resistance value of a storage element of the selected one and a resistance value of the reference resistor, the determination circuit including a first input terminal and a second input terminal, the first input terminal being electrically connected to a second terminal of the storage element included in the selected one, the second input terminal being electrically connected to the fourth terminal of the reference resistor, the reference resistor having a resistance value substantially equal to a value $R_{ref1}$ in the following formula:

$$R_{ref1} = \frac{1}{1-\frac{1}{m^2}}\left[\left(1-\frac{1}{m}\right) + \sqrt{\left(1-\frac{1}{m}\right)^2 + 2\left(1-\frac{1}{m^2}\right)\left(\frac{\sigma_p}{\langle R_p\rangle}\right)^2 \log m}\right]\langle R_p\rangle$$

where <Rap> is a mean value of first resistance values obtained from the storage elements in the high-resistance state of the plurality of memory cells, <Rp> is a mean value of second resistance values obtained from the storage elements in the low-resistance state of the plurality of memory cells, m is a ratio of the mean value of the first resistance values to the mean value of the second resistance values (=<Rap>/<Rp>), and $\sigma_p$ is a standard deviation of the second resistance values.

8. The memory device according to claim 7, wherein the resistance value of the reference resistor is in a range from a value 5% smaller than the resistance value $R_{ref1}$ to a value 5% greater than the resistance value $R_{ref1}$.

9. The memory device according to claim 7, wherein the reference resistor includes:

a first circuit including a first resistance element and a second resistance element that are connected in series with each other; and a second circuit including a third resistance element and a fourth resistance element that are connected in series with each other, the first circuit and the second circuit being connected in parallel, the first resistance element and the second resistance element having a resistance value substantially equal to the mean value of the first resistance values, and the third resistance element and the fourth resistance element having a resistance value substantially equal to the mean value of the second resistance values.

10. The memory device according to claim 7, wherein the reference resistor includes:

a first series circuit including a first resistance circuit and a second resistance circuit that are connected in series; and a second series circuit including a third resistance circuit and a fourth resistance circuit that are connected in series, the first series circuit and the second series circuit being connected in parallel, the first resistance circuit and the second resistance circuit including a first circuit including a first resistance element and a second resistance element that are connected in series, and a second circuit including a third resistance element and a fourth resistance element connected in series, the first circuit and the second circuit being connected in parallel, and each of the first to fourth resistance elements having a resistance value that is substantially equal to the mean value of the first resistance values, and the third resistance circuit and the fourth resistance circuit including a third circuit including a fifth resistance element and a sixth resistance element that are connected in series, and a fourth circuit including a seventh resistance element and an eighth resistance element that are connected in series, the third circuit and the fourth circuit being connected in parallel, and each of the fifth to eighth resistance elements having a resistance value that is substantially equal to the mean value of the second resistance values.

11. A memory device comprising:

a plurality of memory cells each including a storage element having a first terminal and a second terminal, the storage element being changeable from one of a high-resistance state and a low-resistance state to the other;

a reference resistor having a third terminal and a fourth terminal;

a selection circuit configured to select one of the plurality of memory cells;

a first current source electrically connected to a first terminal of a storage element of the selected one of the plurality of memory cells;

a second current source electrically connected to the third terminal of the reference resistor; and a determination circuit configured to determine the greater one among a resistance value of the storage element of the selected one of the plurality of memory cells and a resistance value of the reference resistor, the determination circuit including a first input terminal and a second input terminal, the first input terminal being electrically connected to a second terminal of the storage element of the selected one of the plurality of memory cells, the second input terminal being electrically connected to the fourth terminal of the reference resistor, the reference resistor having a resistance value substantially equal to a value $R_{ref2}$ in the following formula:

$$R_{ref2} = \frac{2m}{m+1} \langle R_p \rangle$$

where $\langle Rap \rangle$ is a mean value of first resistance values obtained from the storage elements in the high-resistance state of the plurality of memory cells, $\langle Rp \rangle$ is a mean value of second resistance values obtained from the storage elements in the low-resistance state of the plurality of memory cells, and m is a ratio of the mean value of the first resistance values to the mean value of the second resistance values ($=\langle Rap \rangle / \langle Rp \rangle$).

12. The memory device according to claim 11, wherein the resistance value of the reference resistor is in a range from a value 5% smaller than the resistance value $R_{ref2}$ to a value 5% greater than the resistance value $R_{ref2}$.

13. The memory device according to claim 11, wherein the reference resistor includes:

a first circuit including a first resistance element and a second resistance element that are connected in series with each other; and a second circuit including a third resistance element and a fourth resistance element that are connected in series with each other, the first circuit and the second circuit being connected in parallel, the first resistance element and the second resistance element having a resistance value substantially equal to the mean value of the first resistance values, and the third resistance element and the fourth resistance element having a resistance value substantially equal to the mean value of the second resistance values.

14. The memory device according to claim 11, wherein the reference resistor includes:

a first series circuit including a first resistance circuit and a second resistance circuit that are connected in series; and a second series circuit including a third resistance circuit and a fourth resistance circuit that are connected in series, the first series circuit and the second series circuit being connected in parallel, the first resistance circuit and the second resistance circuit including a first circuit including a first resistance element and a second resistance element that are connected in series, and a second circuit including a third resistance element and a fourth resistance element connected in series, the first circuit and the second circuit being connected in parallel, and each of the first to fourth resistance elements having a resistance value that is substantially equal to the mean value of the first resistance values, and the third resistance circuit and the fourth resistance circuit including a third circuit including a fifth resistance element and a sixth resistance element that are connected in series, and a fourth circuit including a seventh resistance element and an eighth resistance element that are connected in series, the third circuit and the fourth circuit being connected in parallel, and each of the fifth to eighth resistance elements having a resistance value that is substantially equal to the mean value of the second resistance values.

15. A memory device comprising:

a plurality of memory cells each including a storage element having a first terminal and a second terminal, the storage element being changeable from one of a high-resistance state and a low-resistance state to the other;

a reference resistor having a third terminal and a fourth terminal;

a selection circuit configured to select one of the plurality of memory cells;

a first current source electrically connected to a first terminal of a storage element of the selected one of the plurality of memory cells;

a second current source electrically connected to the third terminal of the reference resistor; and a determination circuit configured to determine the greater one among a resistance value of the storage element of the selected one of the plurality of memory cells and a resistance value of the reference resistor, the determination circuit having a first input terminal and a second input terminal, the first input terminal being electrically connected to a second terminal of the storage element of the selected one of the plurality of memory cells, the second input terminal being electrically connected to the fourth terminal of the reference resistor, the reference resistor including:

a first circuit including a first resistance element and a second resistance element that are connected in series; and a second circuit including a third resistance element and a fourth resistance element that are connected in series, the first circuit and the second circuit being connected in parallel, the first resistance element and the second resistance element having a resistance value that is substantially equal to a mean value of first resistance values obtained from the storage elements in the high-resistance state of the plurality of memory cells, and the third resistance element and the fourth resistance element having a resistance value that is substantially equal to a mean value of second resistance values obtained from the storage elements in the low-resistance state of the plurality of memory cells.

* * * * *